US009234952B2

(12) United States Patent  (10) Patent No.: US 9,234,952 B2
Koay  (45) Date of Patent: Jan. 12, 2016

(54) SYSTEM AND METHOD FOR DETERMINING K-SPACE VIEWS AND DIFFUSION WEIGHTING DIRECTIONS USING CENTROIDAL VORONOI TESSELLATIONS

(71) Applicant: Wisconsin Alumni Research Foundation, Madison, WI (US)

(72) Inventor: Cheng Guan Koay, Madison, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 513 days.

(21) Appl. No.: 13/792,663

(22) Filed: Mar. 11, 2013

(65) Prior Publication Data

US 2014/0253118 A1   Sep. 11, 2014

(51) Int. Cl.
*G01R 33/48*   (2006.01)
*G01R 33/563*   (2006.01)

(52) U.S. Cl.
CPC ...... *G01R 33/4826* (2013.01); *G01R 33/56341* (2013.01)

(58) Field of Classification Search
CPC .............. G01R 33/4826; G01R 33/56341
See application file for complete search history.

(56) References Cited

U.S. PATENT DOCUMENTS

| | | | |
|---|---|---|---|
| 6,992,484 B2* | 1/2006 | Frank | G01R 33/56341 324/307 |
| 7,358,730 B2 | 4/2008 | Mistretta et al. | |
| 8,055,048 B2 | 11/2011 | Nielles-Vallespin et al. | |
| 8,214,013 B2 | 7/2012 | Shu et al. | |
| 8,330,462 B2 | 12/2012 | Poupon et al. | |
| 8,482,284 B2 | 7/2013 | Koay et al. | |
| 8,852,103 B2* | 10/2014 | Rothberg | A61B 8/4254 600/438 |
| 9,022,936 B2* | 5/2015 | Rothberg | A61B 8/4254 600/438 |
| 9,028,412 B2* | 5/2015 | Rothberg | A61B 8/4254 600/438 |
| 9,033,884 B2* | 5/2015 | Rothberg | A61B 8/4254 600/438 |

OTHER PUBLICATIONS

Ahmad, et al., Quasi Monte Carlo-based Isotropic Distribution of Gradient Directions for Improved Reconstruction Quality of 3D EPR Imaging, J. Magn. Reson., 2007, 184(2):236-245.
Augenbaum, et al., On the Construction of the Voronoi Mesh on a Sphere, Journal of Computational Physics, 1985, 59(2):177-192.
Deriche, et al., Optimal Real-Time Q-Ball Imaging Using Regularized Kalman Filtering with Incremental Orientation Sets, Medical Image Analysis, 2009, 13:564-579.
Du, et al., Centroidal Voronoi Tessellations: Applications and Algorithms, SIAM Review, 1999, 41(4):637-676.
Du, et al., Convergence of the Lloyd Algorithm for Computing Centroidal Voronoi Tessellations, SIAM Journal on Numerical Analysis, 2006, 44(1):102-119.

(Continued)

*Primary Examiner* — Dixomara Vargas
(74) *Attorney, Agent, or Firm* — Quarles & Brady, LLP; Jonathan D. Stone

(57) ABSTRACT

Described here are a system and method for generating uniform antipodally symmetric point sets that define diffusion-weighting directions or three-dimensional radial k-space trajectories for magnetic resonance imaging. The point sets are generated robustly and efficiently using a constrained centroidal Voronoi tessellation endowed with a pseudometric. This pseudometric is derived from a measure of the electrostatic energy of points distributed on a hemispherical surface.

13 Claims, 5 Drawing Sheets

(56) References Cited

OTHER PUBLICATIONS

Dubois, et al., Optimized Diffusion Gradient Orientation Schemes for Corrupted Clinical DTI Data Sets, Magn. Reson. Mater. Phy., 2006, 19(3):134-143.

Graham, An Efficient Algorith for Determining the Convex Hull of a Finite Planar Set, Information Processing Letters, 1972, 1(4):132-133.

Jones, et al., Optimal Strategies for Measuring Diffusion in Anisotropic Systems by Magnetic Resonance Imaging, Magnetic Resonance in Medicine, 1999, 42:515-525.

Koay, A Simple Scheme for Generating Nearly Uniform Distribution of Antipodally Symmetric Points on the Unit Sphere, J. Comput. Sci., 2011, 2(4):377-381.

Koay, Analytically Exact Spiral Scheme for Generating Uniformly Distributed Points on the Unit Sphere, J. Comput. Sci., 2011, 2(1):88-91.

Koay, et al., Extremely Efficient and Deterministic Approach to Generating Optimal Ordering of Diffusion MRI Measurements, Medical Physics, 2011, 38:4795-4801.

Koay, et al., Sparse and Optimal Acquisition Design for Diffusion MRI and Beyond, Med. Phys., 2012, 39 (5):2499-2511.

Lloyd, Least Squares Quantization in PCM, IEEE Transactions on Information Theory, 1982, IT-28(2):129-137.

Rakhmanov, et al., Minimal Discrete Energy on the Sphere, Mathematical Research Letters, 1994, 1:647-662.

Renka, Algorithm 772: Stripack: Delaunay Triangulation and Voronoi Diagram on the Surface of a Sphere, ACM Transactions on Mathematical Software (TOMS), 1997, 23(3):416-434.

Saff, et al., Distributing Many Points on a Sphere, The Mathematical Intelligencer, 1997, 19:5-11.

Thomson, on the Structure of the Atom: An Investigation of the Stability and Periods of Oscillation of a Number of Corpuscles Arranged at Equal Intervals Around the Circumference of a Circle With Application of the Results to the Theory of Atomic Structure, Philosophical Magazine Series 6, 1904, 7(39):237-265.

Wong, et al., A Strategy for Sampling on a Sphere Applied to 3D Selective RF Pulse Design, Magnetic Resonance in Medicine, 1994, 32:778-784.

* cited by examiner

SYSTEM AND METHOD FOR DETERMINING K-SPACE VIEWS AND DIFFUSION WEIGHTING DIRECTIONS USING CENTROIDAL VORONOI TESSELLATIONS

STATEMENT REGARDING FEDERALLY SPONSORED RESEARCH

This invention was made with government support under MH090912 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for calculating and selecting a k-space sampling pattern or diffusion gradient table.

The problem of constructing a set of uniformly-distributed points on the surface of a sphere has a long and interesting history, which dates back to J. J. Thomson in 1904, as described by J. J. Thomson in "On the Structure of the Atom: An Investigation of the Stability and Periods of Oscillation of a Number of Corpuscles Arranged at Equal Intervals Around the Circumference of a Circle; with Application of the Results to the Theory of Atomic Structure," *Philosophical Magazine*, 1904; 7(39):237-265. A particular variant of the Thomson problem that is of great importance to biomedical imaging is the problem of generating a nearly uniform distribution of points on the sphere via a deterministic scheme. Although the point set generated through the minimization of electrostatic potential based Coulomb's law is the gold standard, minimizing the electrostatic potential of one thousand or more points, or charges, remains a formidable task.

Therefore, a deterministic scheme capable of efficiently and accurately generating a set of uniformly-distributed points on the sphere has an important role to play in many biomedical and engineering applications, such as three-dimensional projection reconstruction of medical images, three-dimensional selective radiofrequency pulse design in MRI, and diffusion-weighting direction design and selection in diffusion MRI. Many deterministic schemes have been proposed in the past, including those described by E. Saff and A. Kuijlaars in "Distributing Many Points on a Sphere," *The Mathematical Intelligencer*, 1997; 19:5-11; by E. Rakhmanov, et al., in "Minimal Discrete Energy on the Sphere," *Mathematical Research Letters*, 1994; 1:647-662; and by R. Ahmad, et al., in "Quasi Monte Carlo-based isotropic distribution of gradient directions for improved reconstruction quality of 3D EPR imaging," *Journal of Magnetic Resonance*, 2007; 184(2):236-245.

The challenge remains, however, to provide a deterministic method for producing a uniform distribution of points on the surface of a sphere that is advantageous for medical imaging applications, such as those referred to above. Notably, for determining diffusion-weighting directions, the point set should present antipodal symmetry, which currently existing methods do not provide.

The importance and the effects of view-ordering on image quality in MRI has been studied extensively in many subfields, such as two-dimensional Cartesian acquisitions; radial fast spin echo ("FSE") acquisitions; and four-dimensional MR angiography with three-dimensional radial acquisitions. For example, the basic idea of FSE is to acquire multiple echoes within each excitation or within the same repetition time ("TR"). FSE acquisitions can provide for a significant reduction in scan time, which can be used to improve image resolution. However, the acquisition of multiple echoes within the same excitation comes at a cost of enhanced image artifacts, such as blurring or ringing because of $T_2$ decay, which produces signal modulations in k-space. Therefore, different view-ordering strategies have been developed and used in an effort to make the signal modulation as incoherent as possible in k-space.

Among the many studies on the relative merits of various diffusion gradient schemes, it is well accepted that the uniformity of the diffusion gradient schemes plays an important role in the final estimate of any diffusion MRI or diffusion tensor-derived quantities. It was first suggested by D. K. Jones, et al., in "Optimal Strategies for Measuring Diffusion in Anisotropic Systems by Magnetic Resonance Imaging," *Magnetic Resonance in Medicine*, 1999; 42(3):515-525, that the diffusion gradient vectors should be endowed with antipodal symmetry. Because diffusion MRI measurements are acquired sequentially with distinct unit gradient directions, it has been shown that different orderings, or sequences, of the gradient directions have different effects on the quality of tensor-derived quantities obtained from partial scans, or some subset of the complete measurements, as described, for example, by J. Dubois, et al., in "Optimized Diffusion Gradient Orientation Schemes for Corrupted Clinical DTI Data Sets," *Magnetic Resonance Materials in Physics, Biology and Medicine*, 2006; 19(3):134-143.

Even though several methods have been proposed to generate optimal orderings of gradient directions, the fact that these methods have not been in routine clinical use may be attributed to two major problems of computational inefficiency. The first problem is that the existing methods for generating highly uniform and antipodally symmetric points on the unit sphere are iterative and inefficient, which may take up to many minutes to several hours to complete, and yet without any clue of whether convergence has been achieved. The second problem is that previously proposed methods for generating optimal ordering of gradient directions are based upon simulated annealing, which takes on the order of 137 hours to generate the ordering for a set of 150 points, as mentioned, for example, by R. Deriche, et al., in "Optimal Real-Time Q-Ball Imaging using Regularized Kalman Filtering with Incremental Orientation Sets," *Medical Image Analysis*, 2009; 13(4):564-579.

It would therefore be desirable to provide a method for generating, in a computationally efficient manner, a set of points that are highly uniformly distributed on the surface of a sphere and that exhibit antipodal symmetry.

SUMMARY OF THE INVENTION

The present invention overcomes the aforementioned drawbacks by providing a system and method for generating an ordering a highly uniform and antipodally symmetric point set that defines acquisition parameters for magnetic resonance imaging ("MRI"). The point sets are generated robustly and efficiently using a constrained centroidal Voronoi tessellation endowed with a pseudometric that is derived from a measure of the electrostatic energy of points distributed on a hemispherical surface.

It is an aspect of the invention to provide a method for producing an image of a subject with an MRI system. The method includes determining MRI acquisition parameters by generating a point set that defines the MRI acquisition parameters. Each point is computed as a generator of a centroidal Voronoi tessellation that is formed using a pseudometric on a sphere that enforces antipodal symmetry of points distributed on a hemisphere of the sphere. The point set thus defines points that are substantially uniformly and antipodally distributed on a surface of a sphere. The MRI system is then directed to acquire k-space data from a subject using the determined MRI acquisition parameters, and an image of the subject is reconstructed from the acquired k-space data.

It is another aspect of the invention to provide a method for producing an image of a subject with an MRI system. In this method, a look-up table that defines points on a sphere that are substantially uniformly distributed on the surface of the sphere is provided. Each point in the look-up table corresponds to the centroid of a centroidal Voronoi tessellation that is defined by a pseudometric on a sphere that enforces antipodal symmetry of points distributed on a hemisphere of the sphere. MRI acquisition parameters are then determined using the provided look-up table, and the MRI system is directed to acquire k-space data from a subject using the determined MRI acquisition parameters. An image of the subject is then reconstructed from the acquired k-space data.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
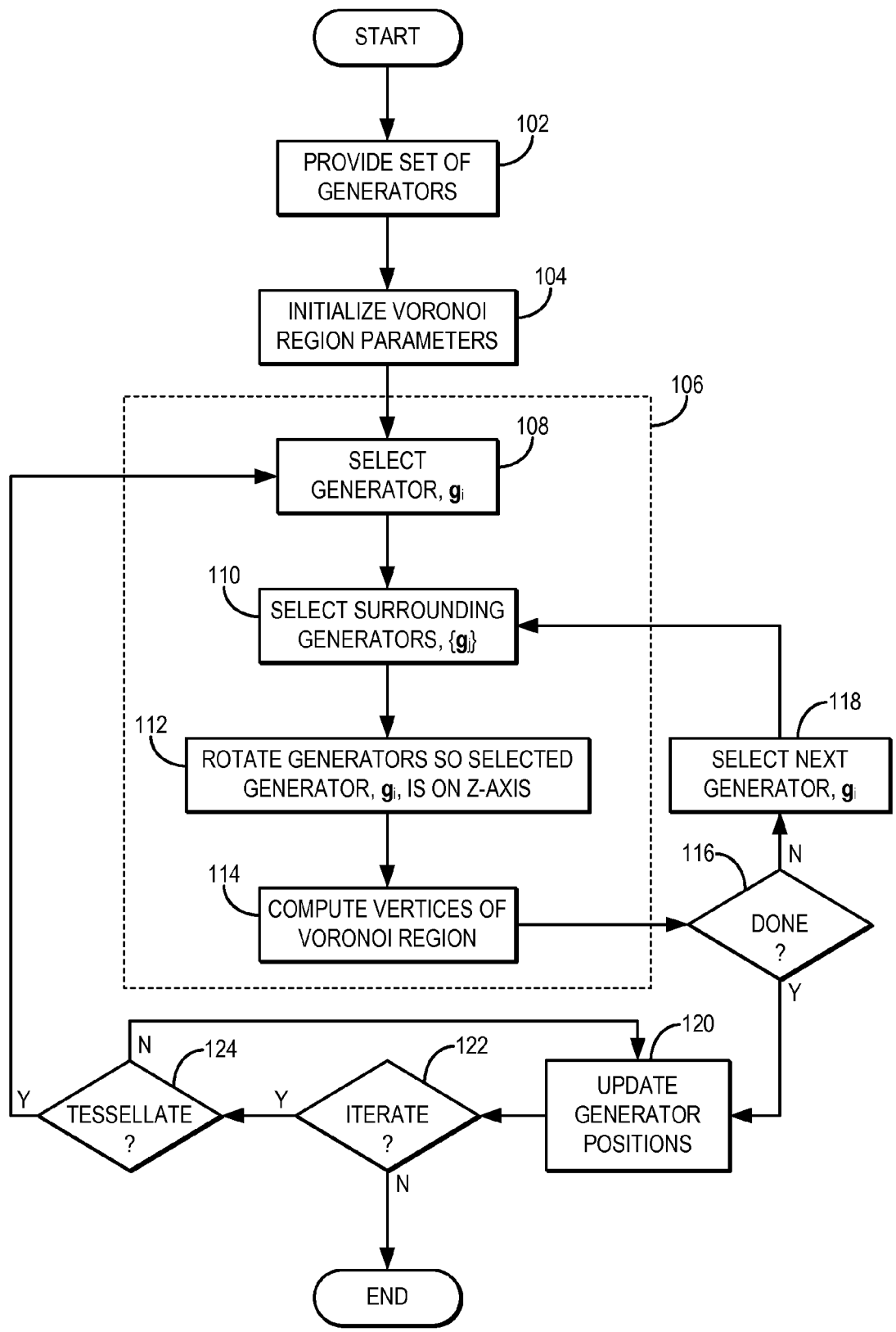
FIG. 1 is a flowchart setting forth the steps of an example of a method for using centroidal Voronoi tessellations to generate a point set that is highly uniformly distributed on the surface of a sphere, and that exhibits antipodal symmetry.

Described here are a system and method for generating uniform antipodally symmetric point sets that define diffusion-weighting directions or three-dimensional radial k-space trajectories. The point sets are generated robustly and efficiently using a constrained centroidal Voronoi tessellation endowed with a pseudometric.

A centroidal Voronoi tessellation is a Voronoi tessellation in which the center of mass, or centroid, of the Voronoi region is also its generator and in which the Voronoi regions can be prescribed with a density function. It is a discovery of the present invention that a centroidal Voronoi tessellation is capable of generating uniform antipodally symmetric points on the unit sphere. Instead of employing a density function that is constant and invariant with respect to spatial inversion or antipodally symmetry, a novel pseudometric is used in the centroidal Voronoi tessellation so as to make generating uniform, antipodally symmetric points on the unit sphere possible.

By way of example, the spherical Voronoi regions, $\{V_i\}_{i=1}^{N}$, on a hemisphere (e.g., the upper hemisphere) of a spherical surface (e.g., the unit sphere) are characterized by the following properties. First, no two distinct regions share the same point. That is, the intersection between any two distinct regions is empty, $V_i \cap V_j = \emptyset$ with $i \neq j$. Points on the boundary between any two Voronoi regions belong to the closure of these regions, which is denoted as $\overline{V}_i$. The union of all the closures of the spherical Voronoi regions covers the hemisphere, and is denoted by $s_+^2$. With these properties, the Voronoi regions can be defined as, $$V_i = \{x \in s_+^2 \mid d(x, g_i) < d(x, g_j)\} \text{ for } j=1, \ldots, N \text{ and } j \neq i \quad (1).$$

Each of the unit vectors, $\{g_i\}_{i=1}^{N}$, on $s_+^2$ is called the generator of its respective Voronoi region. The pseudometric, d, is defined as follows.

The center of mass of each Voronoi region does not necessarily coincide with the generator of that region. An iterative method, such as Lloyd's algorithm, may be used to make the generators from each successive iteration closer to the centers of mass of their respective regions. The resultant tessellations are referred to as centroidal Voronoi tessellations.

The center of mass of a spherical Voronoi region, $V_i$, can be expressed as, $$\hat{g}_i = \frac{\int v d\sigma_i}{\|\int v d\sigma_i\|}; \quad (2)$$

where $\sigma_i$ is the spherical surface of the spherical Voronoi region, $V_i$; v is a unit vector normal to the spherical surface element, $d\sigma_i$; and $\|\cdot\|$ is the Euclidean norm, which is utilized to ensure that $\hat{g}_i$ has a unit length. In practice, the computation of $\hat{g}_i$ is based on the discretized version of Eqn. (2). For instance, $\hat{g}_i$ is obtained through the sum of the products between the area of the spherical triangle formed by the generator and each pair of consecutive vertices at the boundary surrounding the generator in counterclockwise order. The density function, which usually appears as a factor in the integrand of Eqn. (2), is taken to be a unit constant function in order to ensure uniformity of the generators.

The distance measure, d(:,:), used above in Eqn. (1) is an extension of the modified electrostatic potential energy term described by C. G. Koay, et al., in "Sparse and optimal acquisition design for diffusion MRI and beyond," *Med Phys*, 2012; 39(5):2499-2511. For completeness, the concept of real and virtual points is introduced for manipulating the antipodally symmetric point set. Due to the constraint of antipodal symmetry, points are classified as real and their corresponding antipodal points as virtual. If N real points exist on one hemisphere of a spherical surface (e.g., the upper hemisphere), and these points are denoted by unit vectors $r_i$ with $i=1, \ldots, N$, then the total electrostatic energy for the complete configuration of 2N points of both real and virtual points on the whole sphere is given by:

$$\varphi = \frac{N}{2} + 2\sum_{i=1}^{N-1}\sum_{j=i+1}^{N}\left(\frac{1}{r_{ij}} + \frac{1}{\sqrt{4-r_{ij}^2}}\right); \quad (3)$$

with, $$r_{ij} = \|r_i - r_j\| \quad (4).$$

Eqn. (3) is expressed solely in terms of real points. The summed term in Eqn. (3) can be defined as a metric as follows:

$$S(r_i, r_j) \equiv \frac{1}{r_{ij}} + \frac{1}{\sqrt{4-r_{ij}^2}}. \quad (5)$$

This metric can be generalized as follows:

$$S(r_i, r_j) \equiv \frac{1}{r_{ij}^n} + \frac{1}{(4-r_{ij}^2)^{n/2}}; \quad (6)$$

where n is a positive integer. The metric, $S(r_i,r_j)$, can be thought of as a reciprocal metric, or a reciprocal of the distance measure, between two real points. This reciprocal metric can be exploited by defining the pseudometric, $d(:,:)$, as, $$d(r_i, r_j) = \frac{1}{S(r_i, r_j)}. \quad (7)$$

This term is pseudometric because, for example, when $d(r_i,r_j)=0$ then $d(r_i,-_j)=0$. It is a discovery of the present invention that this reciprocal of the reciprocal metric, $S(r_i,r_j)$, can be treated as a pseudometric in the antipodally symmetric space.

The implementation of spherical Voronoi tessellations is not a trivial computational task, and the method of the present invention thus improves upon existing methods for implementing spherical Voronoi tessellations, such as those described by J. M. Augenbaum and C. S. Peskin in "On the construction of the Voronoi mesh on a sphere," *Journal of Computational Physics*, 1985; 59(2):177-192; and by R. J. Renka in "Algorithm 772: STRIPACK: Delaunay triangulation and Voronoi diagram on the surface of a sphere," *ACM Trans Math Softw*, 1997; 23(3):416-434. To compare and contrast the method of the present invention, an outline of Lloyd's algorithm is presented first.

---

Let N be the number of desired points on the upper hemisphere.
Step 1. Deterministically generate 2N highly uniform points on the unit sphere and select those points that are on the upper hemisphere as the generators.
Step 2. Construct the spherical Voronoi regions of the upper hemisphere with the chosen generators.
Step 3. Compute the normalized centroids using the discretized version of Eqn. (2).
Step 4. Adopt the normalized centroids as the generators.
Step 5. Iterate Steps 2, 3, 4 until convergence it reached.

---

The time complexity of Step 2 above is $O(N \log N)$; therefore, the time complexity of the centroidal Voronoi tessellation is $O(mN \log N)$, where m is the number of iterations needed to reach convergence.

Referring now to FIG. 1, a flowchart setting forth the steps of an example of a method for generating a point set that is highly uniformly distributed on the surface of a sphere, and that exhibits antipodal symmetry, using centroidal Voronoi tessellations is illustrated. This method is contrasted with Lloyd's algorithm described above. The method begins by providing a set of generators, as indicated at step 102. This set of generators may be provided, for example, by deterministically generating a set of highly uniform points on the surface of a unit sphere using an analytically exact spiral scheme, such as the one described by C. G. Koay in "Analytically exact spiral scheme for generating uniformly distributed points on the unit sphere," *Journal of Computational Science*, 2011; 2(1):88-91. Parameters that help define the Voronoi tessellation are then initialized, as indicated at step 104. For instance, this step may include selected the radius of a spherical cap that is sufficient to encompass a number of surrounding generators for the purposes of computing a Voronoi region. An example of how such a radius can be selected is now provided.

If the center of a circle of radius, r, lies on a plane that is tangent to a unit sphere at point $(0,0,1)$, which corresponds to the z-axis, then the inverse Gnomonic projection of that circle is a spherical cap. Because the area of the upper hemisphere of unit radius is $2\pi$, the area associated with a generator can be approximated by $2\pi/N$, where N is the total number of generators on the upper hemisphere. This approximation works well for large N, such as for N=15 and above. The un-normalized areal measure of a spherical cap with an area equal to $2\pi/N$ is related to the radius, r, by the following expression:

$$\frac{2\pi}{N} = 2\pi\left(1 - \frac{1}{\sqrt{1+r^2}}\right). \quad (8)$$

Thus, $$r = \sqrt{\left(\frac{N}{N-1}\right)^2 - 1}. \quad (9)$$

The angle subtended by the longest arc passing through the interior of the spherical cap is given by, $$\theta = 2\tan^{-1}(r) \quad (10).$$

This angle is also the approximate spherical distance between two generators; therefore, any generators that are within $5\theta/2$ in spherical distance away from the generator-of-interest will be classified as "surrounding generators."

If the maximum value of the cumulative sums of distances made by generators in successive iterations is less than some prescribed threshold value, which is a small fraction of the prescribed radius, then tessellation can be avoided for the given iteration, thereby improving computational efficiency of the method. The prescribed value is based on Euclidean distance for simplicity as the local convergence criterion is also based on Euclidean distance. The prescribed threshold value is given as, $$C\sqrt{2(1-\cos(\tan^{-1}(r)))} \quad (11);$$

where C is a positive real number with C<1. By way of example, C may be equal to C=0.15. It is noted that if C is too large, the initial surrounding generators may not be the current surrounding generators, which may cause an error in the Voronoi tessellations. Similarly, if C is too small, more tessellations than are necessary may be performed.

Figure 2A:
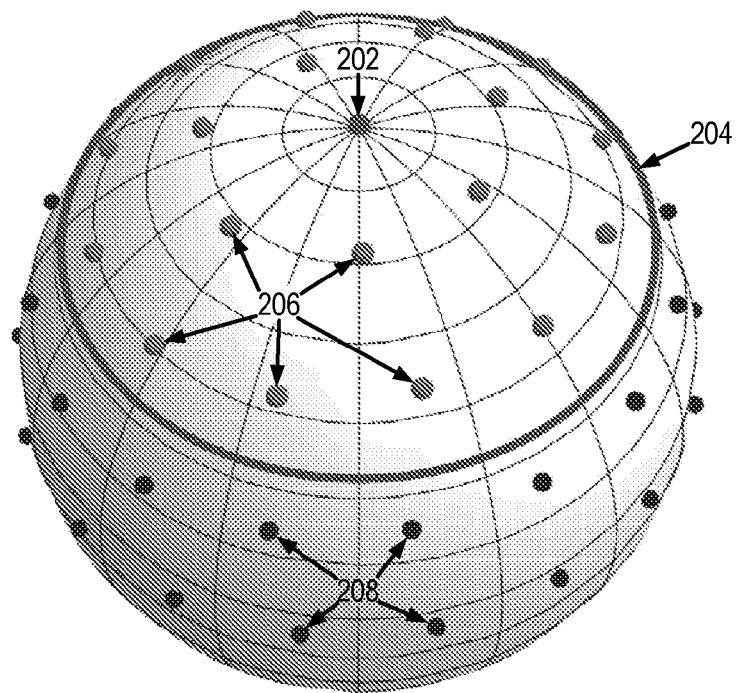
FIG. 2A is an illustration of a set of generators distributed on the surface of a sphere, including a generator-of-interest and its surrounding generators.

Referring still to FIG. 1, the centroidal Voronoi tessellation is carried out by finding a Voronoi region, $V_i$, for a given generator, $g_i$, as generally indicated at 106. First, a generator about which the Voronoi region will be determined is selected, as indicated at step 108. Next, the surrounding generators, $\{g_j\}$, are selected, as indicated at step 110. By way of example, the surrounding generators are selected as those generators within a spherical cap defined by the initialized Voronoi parameters. The selected generator, $g_i$, and the selected surrounding generators, $\{g_j\}$, are collectively rotated such that the selected generator, $g_i$, lies on the z-axis, as indicated at step 112. As shown in FIG. 2A, the selected generator 202 is thus generally located at the apex of the spherical cap 204 that encompasses the surrounding generators 206. Those generators 208 not within the spherical cap 204 are not included as surrounding generators 206.

Figure 2B:
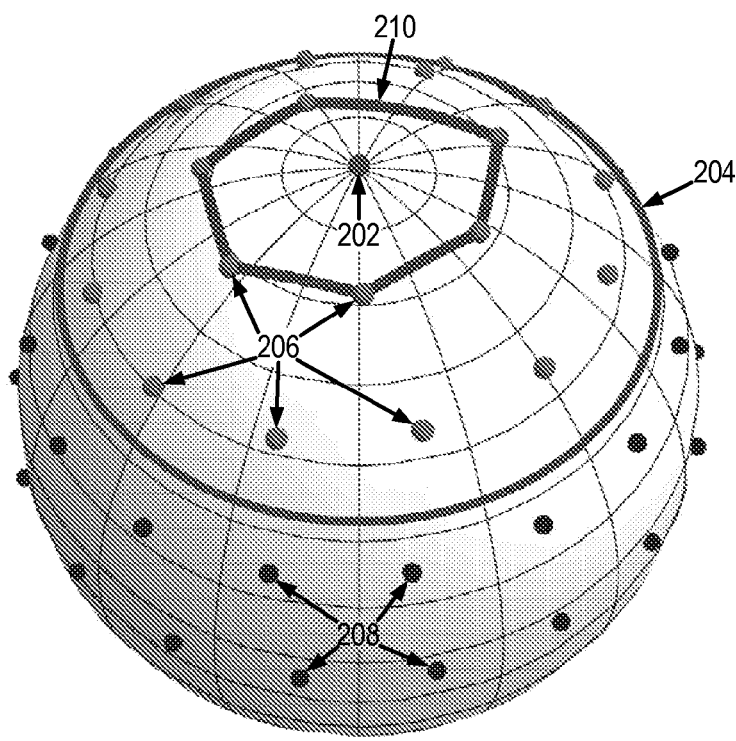
FIG. 2B is an illustration of the set of generators of FIG. 2B and a convex hull formed around the generator-of-interest.
Figure 2C:
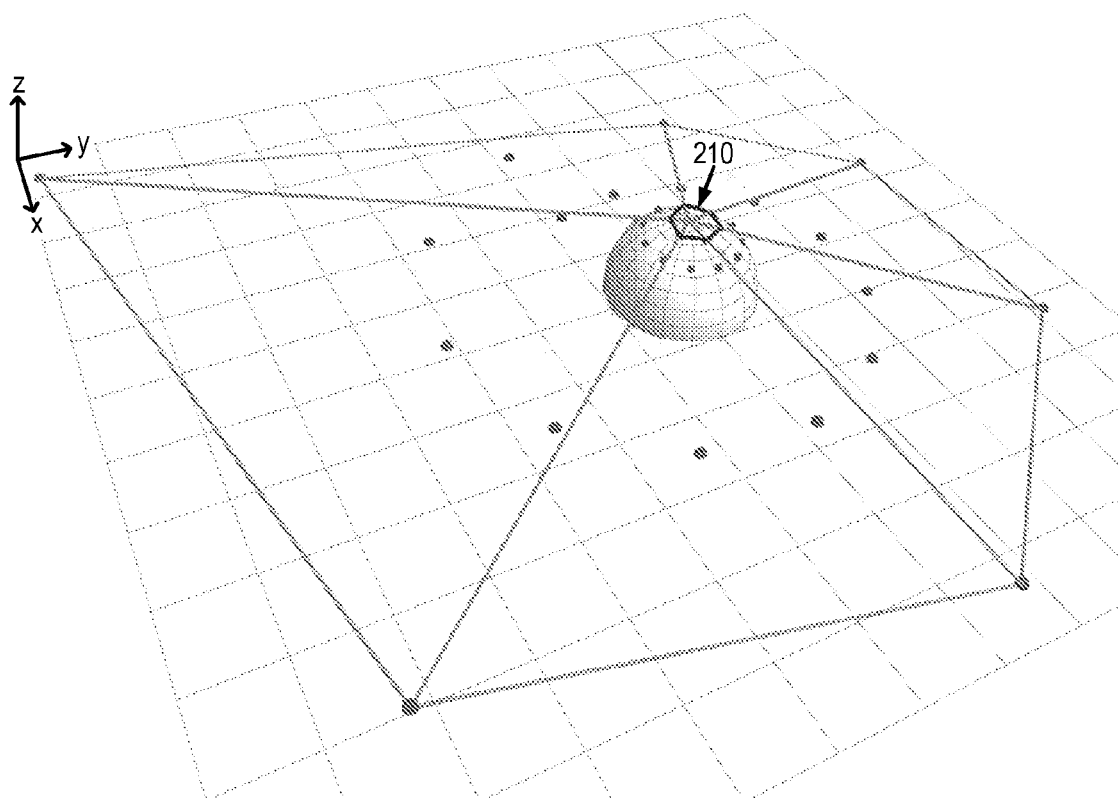
FIG. 2C is an illustration of a stereographic projection of a subset of the surrounding generators of FIG. 2B onto the x-y plane.

Referring again to FIG. 1, after this rotation, the vertices of the Voronoi region are computed, as indicated at step 114. In general, to compute the vertices of the Voronoi region, the smallest convex region formed around the selected generator, $g_i$, by the surrounding generators is computed. An example of this is illustrated in FIG. 2B, where such a convex hull 210 is shown to be surrounding the selected generator 202. Finding this smallest convex region is equivalent to finding the boundary points of the convex hull of the surrounding generators after these generators have been stereographically projected onto the x-y plane, a process which is illustrated in FIG. 2C. The boundary points of the convex hull of a set of points on the plane can then be computed using, for example, a Graham's scan technique, as described by R. L. Graham in "An efficient algorithm for determining the convex hull of a finite planar set," *Information Processing Letters*, 1972; 1(4):132-133. Using the method of the present invention, the vertices of the Voronoi region, the area of spherical triangles formed by the Voronoi vertices, and the generator can all be computed in O(n) for all the provided generators.

Figure 3A:
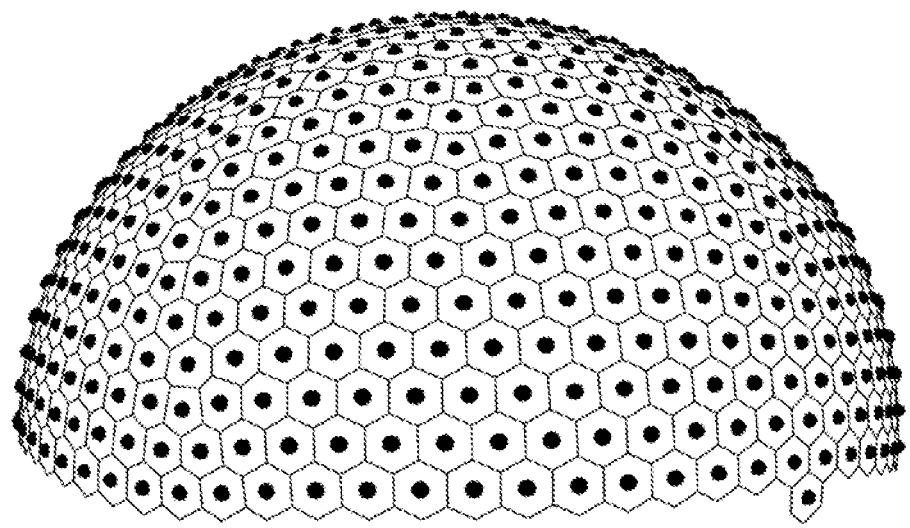
FIG. 3A is an example of an upper hemisphere of centroidal Voronoi tessellations generated in accordance with the present invention.
Figure 3B:
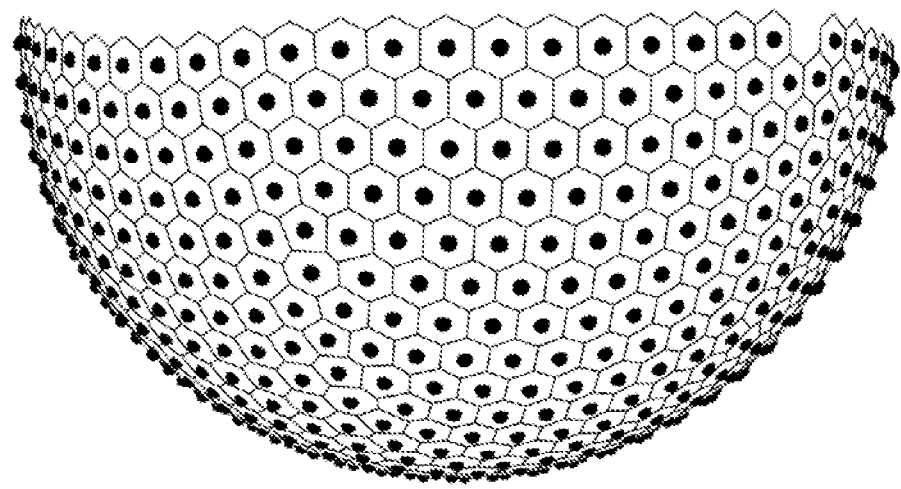
FIG. 3B is an example of a corresponding lower hemisphere of centroidal Voronoi tessellations generated in accordance with the present invention.

A determination is then made at decision block 116 whether a centroidal Voronoi region has been determined for each of the generators. If not, then the next generator is selected at step 118 and its Voronoi region is determined by performing steps 108-114. If all of the Voronoi regions have been determined, then the positions of the generators are updated, as indicated at step 120, such that they are the centroid of the determined Voronoi region. As shown in FIGS. 3A and 3B, some of the vertices around the equator may be located at the lower hemisphere and the resultant centroids may also be on the lower hemisphere. In these instances, the centroids or generators should be reoriented onto $s_+^2$ at each iteration. A determination is then made at decision block 122 whether the algorithm should iterate, or whether convergence has been met. Convergence of the method can be based on a local deviation measure. If convergence has not been met, then a determination is made whether the tessellation steps should be performed in the next iteration, as indicated at decision block 124.

It should be noted that the tessellation steps are the main computational bottleneck of the aforementioned method; thus, it may be desirable to avoid performing these steps at every iteration. The distance between a generator at the current iteration and the same generator from the previous iteration can be computed. This information can be used not only to determine convergence, to compute the cumulative sum of Euclidean distances made by each generators. If the maximum value of these cumulative sums is less than some prescribed value, such as the threshold in Eqn. (11), then the tessellation steps will not be performed in the next iteration. Otherwise, the tessellation steps are performed and the cumulative sum is reset to zero. When the tessellation steps are not performed, the connectivity network between a generator and its surrounding generators will not be altered, but the coordinates of the generator and its surrounding generators will likely be different from one iteration to the next.

The robustness and efficiency of the aforementioned method can be further enhanced through randomization; that is, an additional randomization step, which is designed to have small probability (e.g., 0.01) of invoking the tessellation steps, can be added whenever the maximum value of the cumulative sums of Euclidean distances made by each generators is less than the prescribed value, such as C=0.3.

It is a discovery of the present invention that centroidal Voronoi tessellations can be extended to the antipodally symmetric space, and that the heuristic strategies suggested above for accelerating centroidal Voronoi tessellations without tessellating at every iteration can be used for improving the computation efficiency of determining a set of points that are uniformly and antipodally arranged on the surface of a sphere. The point sets generated in accordance with the present invention exhibit antipodally symmetric uniform sampling strategies, which advantageously improve magnetic resonance image quality, especially when serving as the basis for three-dimensional radial MRI sampling strategies.

Figure 4:
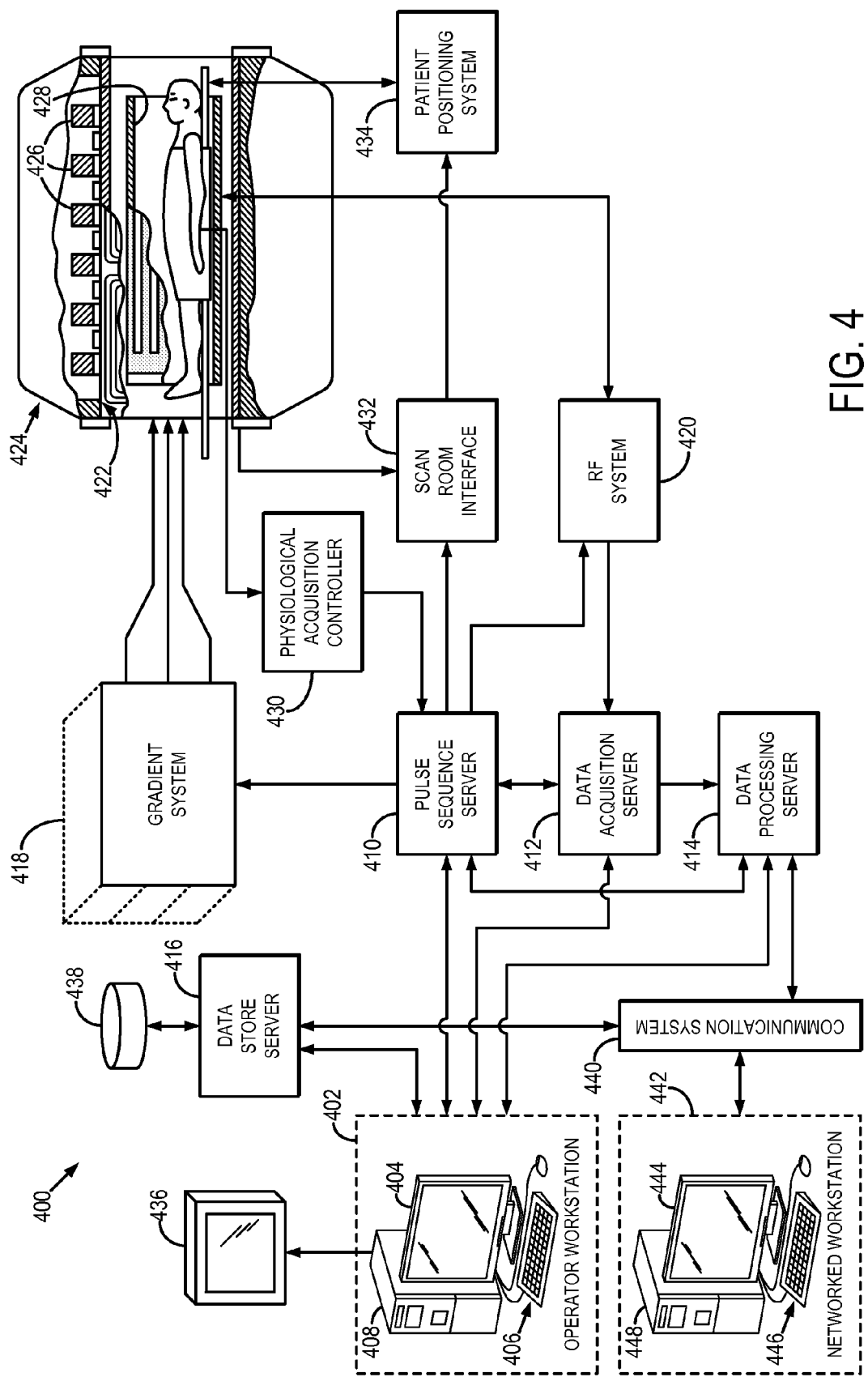
FIG. 4 is a block diagram of an example of a magnetic resonance imaging ("MRI") system that can implement the present invention.

Referring particularly now to FIG. 4, an example of a magnetic resonance imaging ("MRI") system 400 is illustrated. The MRI system 400 includes a workstation 402 having a display 404 and a keyboard 406. The workstation 402 includes a processor 408, such as a commercially available programmable machine running a commercially available operating system. The workstation 402 provides the operator interface that enables scan prescriptions to be entered into the MRI system 400. The workstation 402 is coupled to four servers: a pulse sequence server 410; a data acquisition server 412; a data processing server 414; and a data store server 416. The workstation 402 and each server 410, 412, 414, and 416 are connected to communicate with each other.

The pulse sequence server 410 functions in response to instructions downloaded from the workstation 402 to operate a gradient system 418 and a radiofrequency ("RF") system 420. By way of example, the pulse sequence server 410 can function in response to instructions that include acquisition parameters that are determined by a point set generated in accordance with the present invention. To this end, a look-up table of such points can be provided and used to determine the appropriate acquisition parameters, such as k-space sampling trajectories and diffusion-weighting directions. Gradient waveforms necessary to perform the prescribed scan are produced and applied to the gradient system 418, which excites gradient coils in an assembly 422 to produce the magnetic field gradients $G_x$, $G_y$, and $G_z$ used for position encoding MR signals. The gradient coil assembly 422 forms part of a magnet assembly 424 that includes a polarizing magnet 426 and a whole-body RF coil 428.

RF excitation waveforms are applied to the RF coil 428, or a separate local coil (not shown in FIG. 4), by the RF system 420 to perform the prescribed magnetic resonance pulse sequence. Responsive MR signals detected by the RF coil 428, or a separate local coil (not shown in FIG. 4), are received by the RF system 420, amplified, demodulated, filtered, and digitized under direction of commands produced by the pulse sequence server 410. The RF system 420 includes an RF transmitter for producing a wide variety of RF pulses used in MR pulse sequences. The RF transmitter is responsive to the scan prescription and direction from the pulse sequence server 410 to produce RF pulses of the desired frequency, phase, and pulse amplitude waveform. The generated RF pulses may be applied to the whole body RF coil 428 or to one or more local coils or coil arrays (not shown in FIG. 4).

The RF system 420 also includes one or more RF receiver channels. Each RF receiver channel includes an RF preamplifier that amplifies the MR signal received by the coil 428 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \tag{12};$$

and the phase of the received MR signal may also be determined:

$$\varphi = \tan^{-1}\left(\frac{Q}{I}\right). \tag{13}$$

The pulse sequence server 410 also optionally receives patient data from a physiological acquisition controller 430. The controller 430 receives signals from a number of different sensors connected to the patient, such as electrocardiograph ("ECG") signals from electrodes, or respiratory signals from a bellows or other respiratory monitoring device. Such signals are typically used by the pulse sequence server 410 to synchronize, or "gate," the performance of the scan with the subject's heart beat or respiration.

The pulse sequence server 410 also connects to a scan room interface circuit 432 that receives signals from various sensors associated with the condition of the patient and the magnet system. It is also through the scan room interface circuit 432 that a patient positioning system 434 receives commands to move the patient to desired positions during the scan.

The digitized MR signal samples produced by the RF system 420 are received by the data acquisition server 412. The data acquisition server 412 operates in response to instructions downloaded from the workstation 402 to receive the real-time MR data and provide buffer storage, such that no data is lost by data overrun. In some scans, the data acquisition server 412 does little more than pass the acquired MR data to the data processor server 414. However, in scans that require information derived from acquired MR data to control the further performance of the scan, the data acquisition server 412 is programmed to produce such information and convey it to the pulse sequence server 410. For example, during prescans, MR data is acquired and used to calibrate the pulse sequence performed by the pulse sequence server 410. Also, navigator signals may be acquired during a scan and used to adjust the operating parameters of the RF system 420 or the gradient system 418, or to control the view order in which k-space is sampled. In all these examples, the data acquisition server 412 acquires MR data and processes it in real-time to produce information that is used to control the scan.

The data processing server 414 receives MR data from the data acquisition server 412 and processes it in accordance with instructions downloaded from the workstation 402. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 414 are conveyed back to the workstation 402 where they are stored. Real-time images are stored in a data base memory cache (not shown in FIG. 4), from which they may be output to operator display 412 or a display 436 that is located near the magnet assembly 424 for use by attending physicians. Batch mode images or selected real time images are stored in a host database on disc storage 438. When such images have been reconstructed and transferred to storage, the data processing server 414 notifies the data store server 416 on the workstation 402. The workstation 402 may be used by an operator to archive the images, produce films, or send the images via a network to other facilities.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject with a magnetic resonance imaging (MRI) system, the steps of the method comprising:
   a) determining MRI acquisition parameters by generating a point set that defines the MRI acquisition parameters, each point being computed as a generator of a centroidal Voronoi tessellation that is formed using a pseudometric on a sphere that enforces antipodal symmetry of points distributed on a hemisphere of the sphere, the point set defining points that are substantially uniformly and antipodally distributed on a surface of the sphere;
   b) directing the MRI system to acquire k-space data from a subject using the MRI acquisition parameters determined in step a); and
   c) reconstructing an image of the subject from the k-space data acquired in step b).

2. The method as recited in claim 1 in which the MRI acquisition parameters determined in step a) include at least one of a k-space trajectory and a diffusion-weighting gradient direction.

3. The method as recited in claim 2 in which the k-space trajectory is a three-dimensional radial k-space trajectory.

4. The method as recited in claim 1 in which step a) includes providing a set of initial generators; determining a centroidal Voronoi tessellation for each initial generator; and iteratively updating the centroidal Voronoi tessellations using the pseudometric.

5. The method as recited in claim 4 in which determining the centroidal Voronoi tessellation for each initial generator includes:
   selecting one of the initial generators;
   identifying surrounding generators within a specified distance of the selected initial generator; and
   computing vertices of the centroidal Voronoi tessellation by computing a convex hull using the selected initial generator and the identified surrounding generators.

6. The method as recited in claim 5 in which the vertices of the centroidal Voronoi tessellation are computed by:
   rotating the selected initial generator and the identified surrounding generators such that the selected initial generator lies on a z-axis; and
   stereographically projecting the identified surrounding generators onto an x-y plane.

7. The method as recited in claim 5 in which the specified distance is based on a radius of a spherical cap centered on the selected initial generator.

8. The method as recited in claim 1 in which the pseudometric is based on a measure of electrostatic energy of points distributed on the hemisphere of the sphere.

9. The method as recited in claim 8 in which the pseudometric has the following form:

$$\left(\frac{1}{r_{ij}} + \frac{1}{\sqrt{4-r_{ij}^2}}\right)^{-1};$$

wherein $r_{ij}$ is a Euclidean distance between two points on the surface of the hemisphere.

10. The method as recited in claim 1 in which the pseudometric has the following form:

$$\left(\frac{1}{r_{ij}^n} + \frac{1}{(4-r_{ij}^2)^{n/2}}\right)^{-1};$$

wherein $r_{ij}$ is a Euclidean distance between two points on the surface of the hemisphere and n is a positive integer.

11. A method for producing an image of a subject with a magnetic resonance imaging (MRI) system, the steps of the method comprising:
   a) providing a look-up table that defines points on a sphere that are substantially uniformly distributed on the surface of the sphere, each point corresponding to a centroid of a centroidal Voronoi tessellation that is defined by a pseudometric that enforces antipodal symmetry on the sphere;
   b) determining MRI acquisition parameters using the provided look-up table;
   c) directing the MRI system to acquire k-space data from a subject using the MRI acquisition parameters determined in step b); and
   d) reconstructing an image of the subject from the k-space data acquired in step c).

12. The method as recited in claim 11 in which the MRI acquisition parameters determined in step b) include at least one of a k-space trajectory and a diffusion-weighting gradient direction.

13. The method as recited in claim 12 in which the k-space trajectory is a three-dimensional radial k-space trajectory.

* * * * *